(12) United States Patent
Wong

(10) Patent No.: US 8,041,983 B2
(45) Date of Patent: Oct. 18, 2011

(54) METHOD AND APPARATUS FOR IMPROVING DATA TRANSFER

(75) Inventor: San Wong, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 390 days.

(21) Appl. No.: 12/237,385

(22) Filed: Sep. 24, 2008

(65) Prior Publication Data

US 2009/0019304 A1 Jan. 15, 2009

Related U.S. Application Data

(63) Continuation of application No. 11/039,262, filed on Jan. 18, 2005, now Pat. No. 7,437,591.

(51) Int. Cl.
*G06F 1/04* (2006.01)

(52) U.S. Cl. ........................................ 713/503

(58) Field of Classification Search .................. 713/500, 713/503; 714/30
See application file for complete search history.

(56) References Cited

U.S. PATENT DOCUMENTS

| | | | | |
|---|---|---|---|---|
| 5,452,323 A * | 9/1995 | Rosen | ............................ | 375/354 |
| 5,487,092 A * | 1/1996 | Finney et al. | .................. | 375/354 |
| 5,692,156 A * | 11/1997 | Bahls et al. | .................... | 711/165 |
| 5,793,800 A * | 8/1998 | Jylha et al. | ...................... | 375/219 |
| 6,538,469 B1 * | 3/2003 | Nguyen et al. | ................... | 326/40 |
| 6,671,847 B1 * | 12/2003 | Chao et al. | ........................ | 714/744 |
| 6,877,103 B2 * | 4/2005 | Kuo et al. | ........................ | 713/500 |
| 6,904,375 B1 * | 6/2005 | Sabih et al. | ...................... | 702/75 |
| 7,062,589 B1 * | 6/2006 | Crosland | ........................ | 710/306 |
| 7,143,312 B1 * | 11/2006 | Wang et al. | ...................... | 714/30 |
| 7,350,013 B2 * | 3/2008 | Crosland | ........................ | 710/306 |
| 2004/0268193 A1 * | 12/2004 | Nishida et al. | ................ | 714/724 |
| 2006/0107154 A1 * | 5/2006 | Bansal et al. | .................. | 714/738 |

* cited by examiner

*Primary Examiner* — Raymond Phan
(74) *Attorney, Agent, or Firm* — Martine Penilla & Gencarella, LLP

(57) ABSTRACT

A method for optimizing signal operating parameters for a signal sent over a data transmission channel through a programmable logic device (PLD) is provided. A transmit test pattern is generated and is associated with a set of signal operating parameters for the transmission and receiving of the test pattern over a data transmission channel. The data transmission channel loops from a transmit port to a receive port of the PLD. A determination of whether the received test pattern matches the transmit test pattern is performed. The match results and the set of signal operating parameters are recorded. At least one of the signal operating parameters of the set of signal operating parameters is modified through a processor of the PLD. Another transmit pattern is transmitted and received according to the modified set of signal operating parameters and the results are recorded. Methods for optimizing data transfer into a PLD and corresponding apparatuses are included.

16 Claims, 8 Drawing Sheets

| $V_{dd}$ | PE | Eq. | P/F |
|---|---|---|---|
| A | B | D | F |
| A | B | E | F |
| A | B | G | F |
| A | C | D | P |
| A | C | E | P |
| A | C | G | P |
| A' | B | D | F |
| A' | B | E | F |
| A' | B | G | P |
| : | : | : | : |

METHOD AND APPARATUS FOR IMPROVING DATA TRANSFER

CROSS-REFERENCE TO RELATED APPLICATION

This is a continuation application based on U.S. patent application Ser. No. 11/039,262 filed Jan. 18, 2005, now U.S. Pat. No. 7,437,591 which is herein incorporated by reference in their entirety for all purposes.

BACKGROUND

1. Field of the Invention

This invention relates generally to integrated circuit testing and, in particular, to automated optimization of timing and high-speed interface settings for a programmable logic device.

2. Description of the Related Art

Typically, a programmable logic device (PLD) design is optimized for timing and interface settings through a labor-intensive process, which analyzes off-chip signals. The results of this optimization may be used to develop a specification to guide a customer utilizing the PLD. As the sophistication of these devices is becoming greater, the optimization process is becoming more involved. In addition, the test equipment used to analyze the off-chip signals must keep pace with the sophistication of the devices being tested. Of course, this results in an increased cost for the test equipment as the algorithms and scripts need to be developed to handle the testing of all the capabilities of the device being tested.

One of the shortcomings of the testing through off-chip signals is that the test equipment acts as a source, i.e., provides the stimulation, and an analyzer, i.e., interprets the resulting signal responsive to the stimulation. This requirement certainly adds to the cost of the test equipment. Moreover, the occurrence of rapid technological change prevents the test equipment from being able to test all the capabilities of more advanced integrated circuit designs.

Another shortcoming of tile off chip test equipment is that the signal sent to the device from the off-chip test equipment requires monitoring. That is the signal level, quality, timing, and termination, especially when dealing with data rates of multiple hundreds of megabits per second, are call critical factors handled by the test equipment in order to analyze the chip performance. Failure to adequately protect the signal will result in having to repeat the test, which further delays the process.

As a result, there is a need to solve the problems of the prior art to more effectively optimize timing and high speed interface settings for a programmable logic device.

SUMMARY

Broadly speaking, the present invention fills these needs by providing a method and apparatus for providing internal logic for obtaining the results previously gathered by external test equipment. It should be appreciated that the present invention can be implemented in numerous ways, including as a method, a system, or an apparatus. Several inventive embodiments of the present invention are described below.

In one aspect of the invention, a method for optimizing data transfer into a programmable logic device (PLD) is provided. In the method, data is transferred from the PLD to the external device and then read from the external device according to instructions from an embedded processor of the PLD. The data read from the external device is compared with a copy of the data written into the external device to determine whether a phase shift applied to a clock setting results in the correct data being read. If the data read from the external device matches the copy, then the phase shift is acceptable. The phase shift applied to the clock setting is successively modified through the embedded processor of the PLD. In one embodiment, the phase shift is modified over a phase range that surrounds a phase shift window having acceptable data. Thus, the acceptable range for the phase shift is determined without the need of external test equipment. In another embodiment, the logic blocks of the PLD associated with the transfer of data from the PLD and the reading of the data from the external device are modified for a specified application after completion of the optimization testing.

In another embodiment, a PLD enabled to efficiently transfer data across different clock domains is provided. The PLD includes optimizing logic, which eliminates the need for external test equipment to optimize a phase transfer for transferring data across clock domains of the PLD. The optimizing logic includes a microprocessor having access to a phase shift range, write logic, and read logic. The write logic receives write logic commands from the microprocessor, which causes data to be written to an external device. The read logic reads data from the external device as directed by the microprocessor. The read logic includes logic for comparing the read data to a copy of the written data to determine whether the read data is correct, i.e., matches the written data or a corresponding portion of the written data. The PLD includes a phase-locked loop (PLL) receiving phase control instructions from the microprocessor. The PLL is capable of modifying a phase shift of a resynchronization clock signal according to phase control instructions from the microprocessor. The microprocessor records the phase shift and corresponding correctness of the read data for multiple phase shift values. From this record, a phase shift window associated with correct read data is defined within the phase shift range. In one embodiment, the write logic and the read logic may be reprogrammed for an end user application specific task upon completion of the recording.

In another aspect of the invention, a method for optimizing signal operating parameters for a signal sent over a data transmission channel through a programmable logic device (PLD) is provided. The method initiates with a transmit test pattern being generated. The transmit test pattern is associated with a set of signal operating parameters for the transmission and receiving of the test pattern over a data transmission channel. The data transmission channel loops from a transmit port to a receive port of the PLD. A determination of whether the received test pattern matches the transmit test pattern through a comparison of the two is performed. The comparison results and the set of signal operating parameters are recorded. At least one of the signal operating parameters of the set of signal operating parameters is modified through a processor of the PLD. Another transmit pattern is transmitted and received according to the modified set of signal operating parameters and the results are recorded. This may be repeated until all permutations of the signal operating parameters are swept through.

In one embodiment, a PLD enabled to optimize signal parameter settings for a data transmission channel is provided. The PLD includes a processor providing a plurality of sets of signal parameter settings for transmitting a test pattern and receiving the test pattern. Each set of signal parameter settings may include a pre-emphasis adjustment value, a $V_{od}$ value, and an equalizer adjustment value. A memory region storing the test pattern and a transceiver having a transmitting portion and a receiving portion is included. The transceiver receives a set of signal parameter settings from the processor for transmitting and receiving the test pattern over the data transmission channel. The data transmission channel forms a loop between the transmitting portion and the receiving portion of the transceiver. Comparison circuitry comparing the received test pattern with the transmitted test pattern is also included. The microprocessor tracks the comparison results and the corresponding signal parameter settings. This tracking may be performed for each set of signal parameters to establish table entries indicating what combination of signal parameter settings are successful.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for an apparatus and method for optimizing timing and signal settings for a programmable logic device without the use of conventional external testing equipment. It will be obvious, however, to one skilled in the art, that the present invention may be practiced without some or all of these specific details. In other instances, well known process operations have not been described in detail in order not to unnecessarily obscure the present invention.

A scheme for optimizing timing and signal operating parameters for a programmable logic device (PLD) is discussed below. The embodiments described herein enable the automatic optimization of the timing and signal operating parameters through PLD logic design with an embedded processor. The results of the testing further described below may be communicated to a computing terminal having a display screen, which will display the results for the test engineer. The embedded processor is used to reiteratively adjust a timing parameter, e.g., a phase relationship, or a signal operating parameter that adjusts a transmitted or received signal to establish a report that a test engineer may use to develop specification for the PLD design. Therefore, external testing equipment becomes unnecessary for these tasks.

Figure 1:
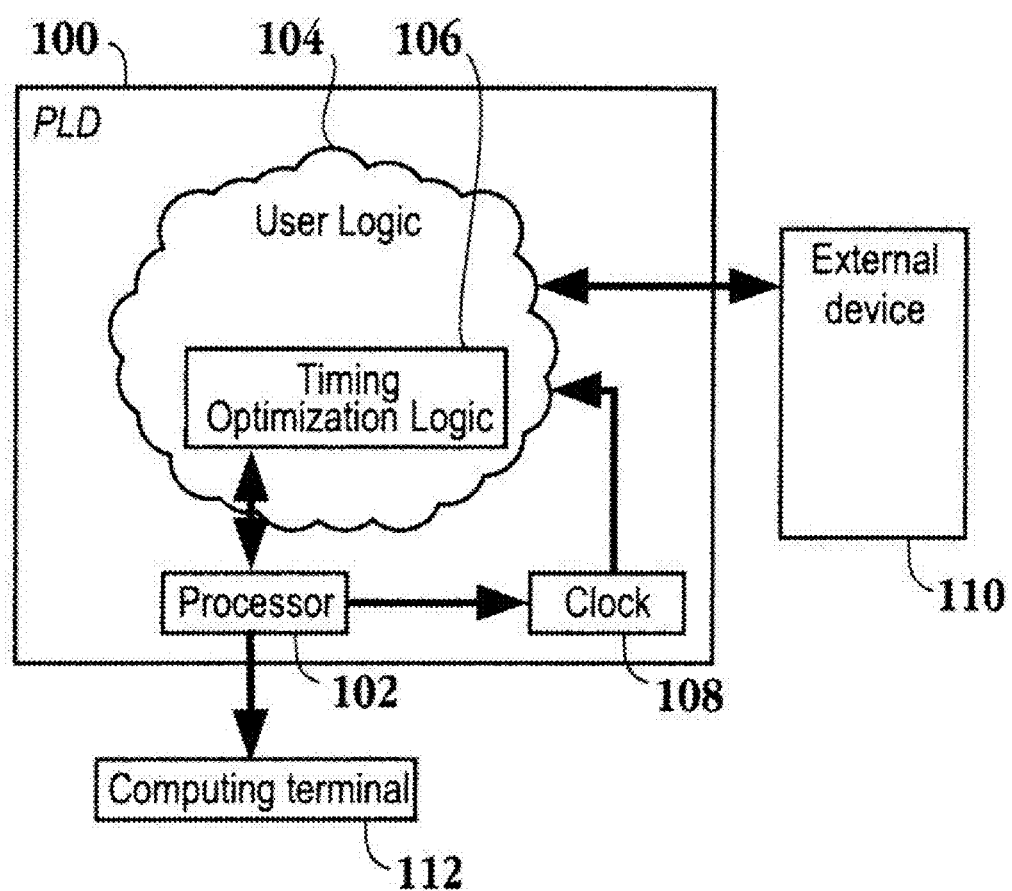
FIG. 1 is a simplified high-level schematic diagram of a programmable logic device enabled to perform optimization of certain timing settings automatically in accordance with one embodiment of the invention.

FIG. 1 is a simplified high-level schematic diagram of a programmable logic device enabled to perform optimization of certain timing settings automatically in accordance with one embodiment of the invention. Programmable logic device (PLD) 100 includes processor 102, user logic 104, and clock 108. User logic 104 includes timing optimization logic 106. PLD 100 is in communication with external device 110 and computing terminal 112. In one embodiment external device 110 is any suitable memory. Computing terminal 112 may be a personal computer or a dumb terminal that is connected to a network. As will be described in more detail below, processor 102 and timing optimization logic 106 enable the elimination of external testing equipment for certain timing and high speed interface settings. That is, the timing optimization and/or attenuation in data and clock path characterization may be carried out automatically through the processor and logic described herein in order to more efficiently characterize PLD 100.

As used herein, a PLD include Programmable read only memories (PROMs), Programmable Logic Arrays (PLA), and Programmable Array Logic/Generic Array Logic (PAL/GAL) and any other integrated circuit that may be programmed by a user to perform a variety of logical functions. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Figure 2:
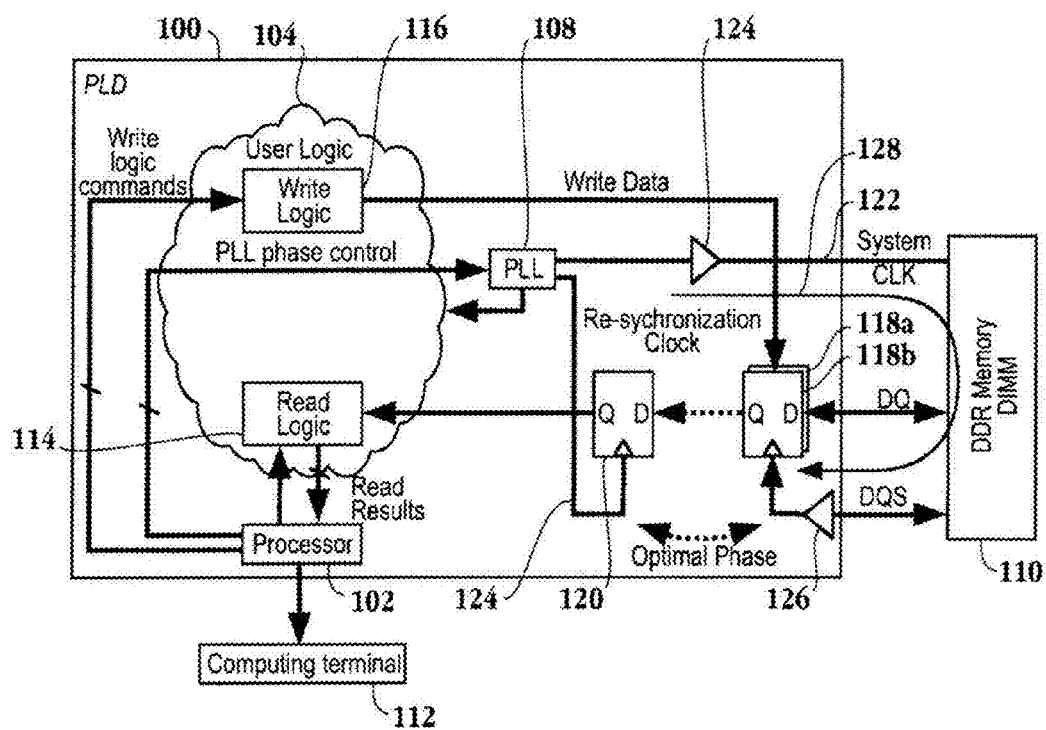
FIG. 2 is a simplified schematic diagram of a programmable logic device to enabled to efficiently transfer data across different clock domains in accordance with one embodiment of the invention.

FIG. 2 is a simplified schematic diagram of a programmable logic device enabled to efficiently transfer data across different clock domains in accordance with one embodiment of the invention. In one embodiment, PLD 100 may incorporate the Armstrong architecture, e.g., as used in STRATIX™ 2, or any other PLD family of the assignee. PLD 100 includes processor 102, user logic 104, which incorporates read logic 114 and write logic 116. For the embodiment incorporating the Armstrong architecture, processor 102 may be the NIOS™ processor of the assignee. PLD 100 also includes phase-locked loop (PLL) 108, which communicates the system clock over line 122 and through buffer 124 to external memory 110. Registers 118a, 118b, and 120 buffer data being read from memory 110. It should be further appreciated that registers 118a, 118b, and 120 buffer the read data across multiple clock domains. For example, a strobe signal associated with a clock domain of memory 110, which is represented by DQS, is received through buffer 126. A second clock domain associated with register 120 is the re-synchronization clock, which is communicated through line 124. PLL 108 controls the clock signals for the system clock, the re-synchronization clock, and the clock to user logic 104. Computing terminal 112 is in communication with processor 102 of PLD 100.

Still referring to FIG. 2, PLL 108 provides a system clock through line 122 to the interface for external device 110. In one embodiment, external device 110 is a double data rate (DDR) memory, which may be a dual in-line memory module (DIMM). DQS represents a clock strobe for external device 110. Therefore, when the system clock triggers the DQS to be transmitted to PLD 100, the corresponding data is latched by registers 118a and 118b. As mentioned above, register 118a, 118b, and 120 provide buffering across the two clock domains, i.e., the DQS clock domain and the re-synchronization clock domain. In order to effectively transfer the data to read logic 114 an optimal phase offset between DQS clock strobe and the re-synchronization clock must be determined. While the DQS strobe is related to the system clock, it should be appreciated that there is some delay between the DQS strobe and a corresponding pulse of the system clock. In one embodiment, where external device 110 is a memory, this delay may be related to a bore trace, memory type, etc.

As illustrated in FIG. 2, external device 110 is a double data rate memory, therefore, the data is transferred to double data rate registers 118a and 118b, and eventually transferred to a single data rate register 120 for eventual transfer into user logic 104. As mentioned above, there are two different clock domains in which the read data traverses, thus, the phase relationship of the signals must be determined in order not to violate the set up time and the hold time. Since the PLL 108 is programmable-through processor 102, the embodiments described herein sweep the PLL phase through a phase range in order to determine a phase window within the phase range that will be acceptable. Processor 102 automatically sweeps through the phase range rather than having the sweep manually performed through external test equipment. Furthermore, the data is recorded by processor 102 and communicated to computing terminal 112, where the data may be presented in tabular or graphical format.

Moving to FIG. 3, which is a simplified schematic diagram illustrating a phase shift window located through the embodiments described with reference to FIG. 2. Line 130 represents a data pulse where valid data is available within region 132. As can be seen, the valid data region 132 is bordered by a set up time $T_{su}$ and a hold time $T_h$. Line 134 represents the DQS strobe, which is triggered from the system clock. As mentioned above, the DQS strobe is slightly offset (delayed) from a system clock pulse (not shown). A plurality of pulses from the re-synchronization clock is shown below the DQS strobe. The plurality of pulses illustrated for the re-synchronization clock are represented by lines 136a, 136b, 136c and 136d. As can be seen for line 136a, the leading edge does not obtain valid data, and would be recorded as a fail since correct data was not read, i.e., the data read would not match the data written. Moving to line 136b, the leading edge of the pulse occurs within valid data region 132. Similarly, line 136c illustrates a pulse in which the leading edge occurs within valid data region 132. Thus, the data read associated with re-synchronization clock pulses 136b and 136c would result in correct data being obtained. Below the re-synchronization clock pulses (136a-d) is a continuum illustrating the phase range and identified phase window. The phase window occurs within region 140, which corresponds to the leading edge of pulse 136b and pulse 136c. Within region 140, the phase shift of the re-synchronization clock yields acceptable reads. Fails are marked in correlation with pulses 136a and 136d, as the phase shift is unacceptable. In one embodiment, a user specifies the phase range, i.e., the user specifies start point 138 and end point 142, which encompass the phase window.

Figures 3, 4:
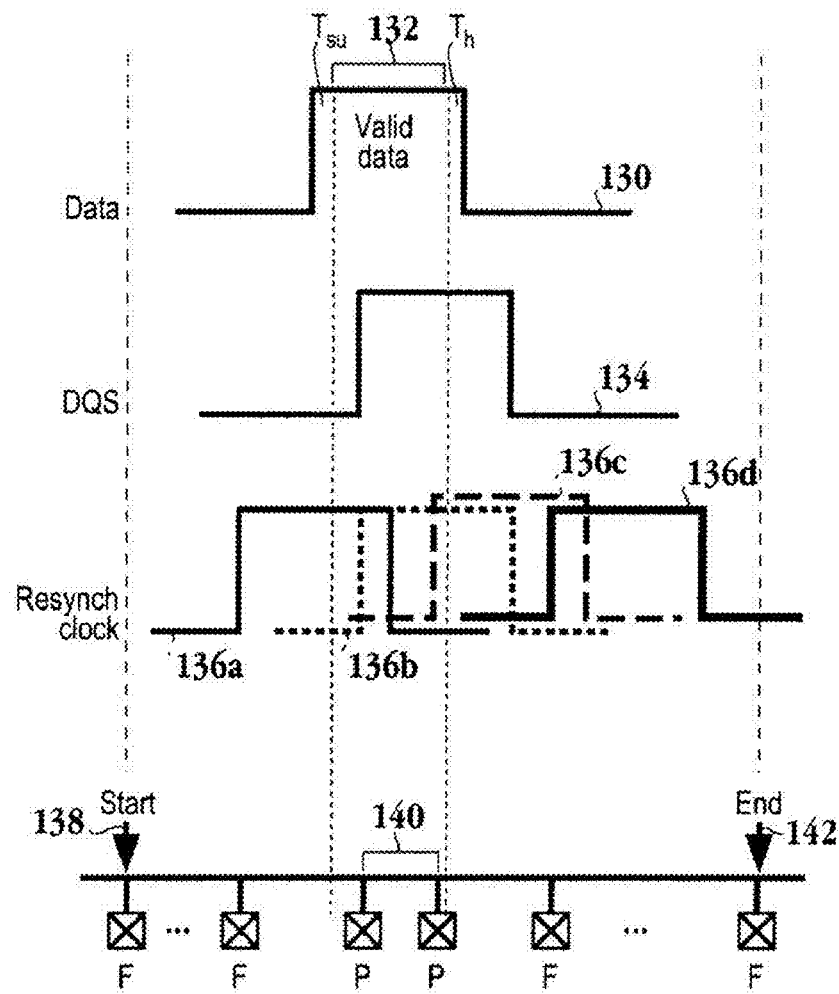
FIG. 3 is a simplified schematic diagram illustrating a phase shift window located through the embodiments described with reference to FIG. 2.
FIG. 4 illustrates a table, which may be generated from the testing described herein in accordance with one embodiment of the invention.

FIG. 4 illustrates a table, which may be generated from the testing described herein in accordance with one embodiment of the invention. The table of FIG. 4 represents the phase and whether the read data was correct or incorrect. As can be seen at phase 0, 20, 80 and 100 fails occurred, i.e., the read data did not match the written data. At phase 40 and 60 a pass was obtained, i.e., the data read matched the written data. In relation to FIG. 3, phase 40 and 60 may be representative of the boundaries of region 140 while phases 0, 20, 80 and 100 may be representative of the fails outside of region 140.

Returning to FIG. 2, in one embodiment, processor 102 compares the contents of the read retrieved from memory to the data that was written to the memory, i.e., a copy of the data written to memory. Thus, for a particular phase shift applied to the re-synchronization clock, processor 102 can track whether the read data is acceptable. Processor 102 instructs write logic 116 to write data into memory 110 in a particular data pattern. The data written into memory 110 may be any amount of data, e.g., a byte of data or filling the entire capacity of the memory. Processor 102 then terminates the writing operation and then issues a read command through read logic 114 specifying the memory address to be read. The read operation is performed and read logic 114 issues an interrupt to processor 102 thereby indicating the read is complete. Processor 102 reads the data from read logic 114 and compares this read result with an expected result. If the data is correct, i.e., the read data and the expected result match, then the phase shift applied to the resynchronization clock is acceptable. If the data does not match, then the phase shift is not acceptable and the read fails.

Figure 5:
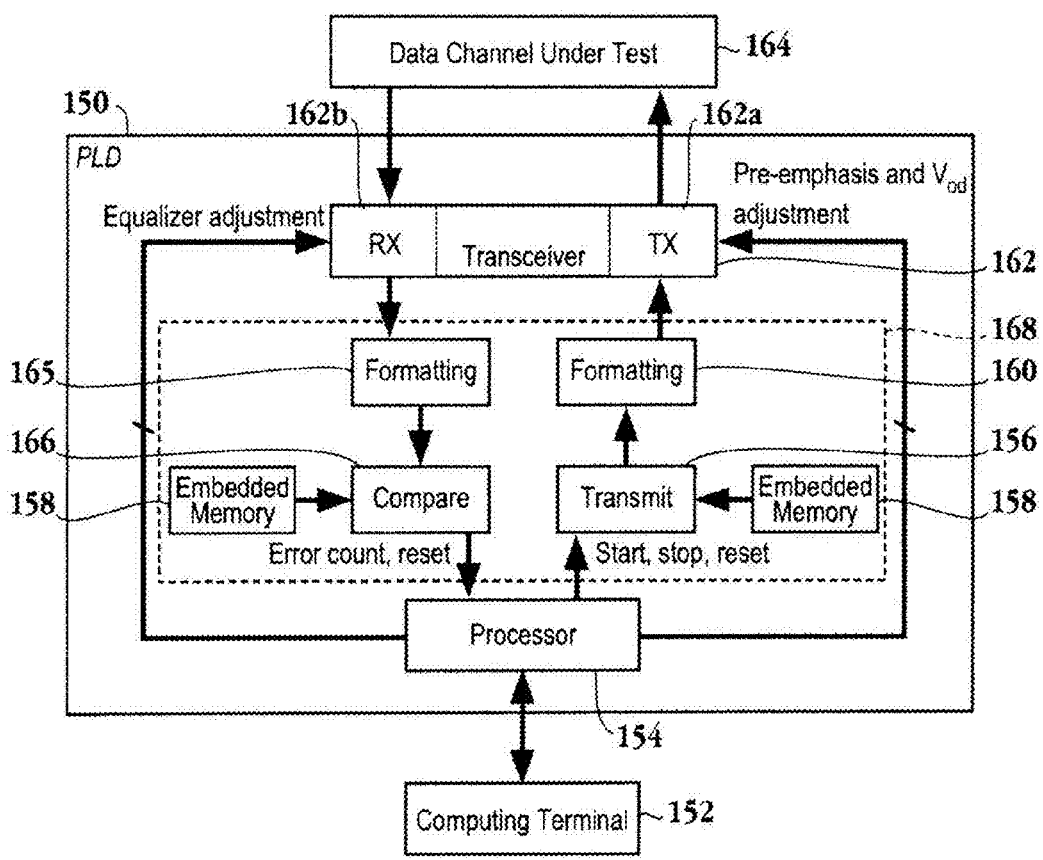
FIG. 5 is a simplified schematic diagram illustrating a programmable logic device enabled to optimize signal parameter settings for a data transmission channel in accordance with one embodiment of the invention.

FIG. 5 is a simplified schematic diagram illustrating a programmable logic device enabled to optimize signal parameter settings for a data transmission channel in accordance with one embodiment of the invention. PLD 150 includes processor 154 and optimizing block 168. Optimizing block 168 includes transmit functionality, which includes transmit module 156, formatting module 160 and embedded memory 158. Optimizing block 168 also includes receiving functionality, which includes compare module 166, formatting module 165 and embedded memory 158. Embedded memory 158 may be the same memory region, or alternatively two separate memory regions. Transceiver 162 includes a transmit portion 162a and a receiving portion 162b.

Processor 154 of FIG. 5 provides parameter settings to transceiver 162. For transmission parameter settings a pre-emphasis value and Voltage outer diameter ($V_{od}$) and an adjustment value are provided. For the receiving portion 162b of transceiver 162, the processor provides an equalizer adjustment value. One skilled in the art will appreciate that $V_{od}$ represents the amplitude of the transmitted signal and the pre-emphasis value represents an overshoot to fight loss from attenuation through the transmission line. On the receiving side, the equalizer adjustment value represents a value, which will open up an eye of a differential signal. Transmitting portion 162a is in communication with one end of data channel under test 164, while receiving portion 162b is in communication with an opposing end of the data channel under test. Thus, data channel under test 164 loops from transmit portion 162a to receive portion 162b. Computing terminal 152 is in communication with processor 154 of PLD 150. In one embodiment, computing terminal 152 is in communication with processor 154 through a RS232 serial port.

It should be appreciated that the signal parameter settings may have a plurality of values. In one embodiment, the $V_{od}$ may have eight different values, the pre-emphasis adjustment value may have 16 different values, and the equalizer adjustment value may have another 16 different values. Therefore, the number of combinations to be tested becomes excessive. Furthermore, when it is found which combinations of the various permutations work, it will be beneficial to define the combinations using the lowest power as these combinations will be the most desired. Processor 154 is capable of sweeping through all the permutations of the various parameter settings described above.

Still referring to FIG. 5, processor 154 defines a test transmit pattern which is sent to transmit module 156 and stored within embedded memory 158. Transmit module 156 then forwards the test transmit pattern to formatting module 160. Formatting module 160 may encode or packetize the test transmit pattern. From formatting module 160 the transmit portion 162a of transceiver 162 then transmits the formatted test pattern over data channel under test 164. Through transmitting portion 162a the pre-emphasis adjustment value and $V_{od}$ value are applied to the transmission signal.

The data is then received by receiving portion 162b where the equalizer adjustment value is applied. The received test pattern is then decoded through formatting module 165 and forwarded to compare module 166. In compare module 166, the received test pattern is compared to the transmitted test pattern, which was stored in embedded memory 158 in order to determine if the received pattern matches the transmitted test pattern. In one embodiment, compare module 166 is a comparator that is used to compare the two bit patterns. Depending on the characteristics of data channel under test 164 and the signal operating parameters applied to the transmit and receive signals, it may be possible that some bits of the test pattern are corrupted when it is received. Moving to FIG. 6, a simplified line diagram illustrates the corruption that may occur during the transmission of the test pattern. Line 170 represents the actual test pattern transmitted to the data channel under test. Line 172 represents the received test pattern. As can be seen, it is possible that certain data may be missed. That is, line 174 represents a cut off between reading a logical 1 and a logical 0. Thus, in two sections of line 172 the receive signal does not approach the height of line 174, however, the transmitted signal of line 170 was above line 174 in those sections and the received data would be corrupt. It should be appreciated that data channel under test 164 may be any suitable line and any suitable length of line. In order to test different line lengths, a test engineer may just replace the line functioning as data channel under test 164 with a smaller or larger line.

Figures 6, 7:
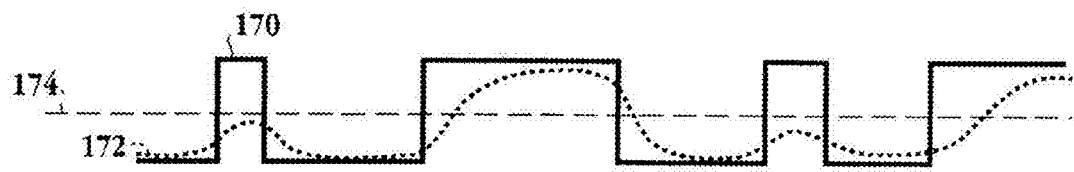
FIG. 6 is a simplified line diagram illustrates the corruption that may occur during the transmission of the test pattern.
FIG. 7 represents an exemplary table, which may be recorded by the processor, and displayed on the computing terminal of FIG. 5.

FIG. 7 represents an exemplary table, which may be recorded by the processor, and displayed on the computing terminal of FIG. 5. Here, the processor records settings for each of the signal operating parameters and the resulting comparison of the transmitted test pattern and the received test pattern. Thus, the processor will sweep through each of the permutations for all the combinations of the signal operating parameters and associate the comparison results with each combination. In addition, after the table is compiled the settings utilizing the lowest power consumption may easily be identified through the table of FIG. 7. Here again, the embodiments eliminate the need for external test equipment to cycle through signals to PLD 150 in order to stimulate a response, which then must be sent off chip and analyzed. Thus, the embodiments described herein take advantage of the programmable logic in order to complete the timing optimization described herein. Furthermore, the read logic and write logic used for optimizing the signal parameters and/or phase relationships may be programmed for other functionality for the end user. Therefore, in one aspect, the hardware for the optimization scheme described herein is free.

Figure 8:
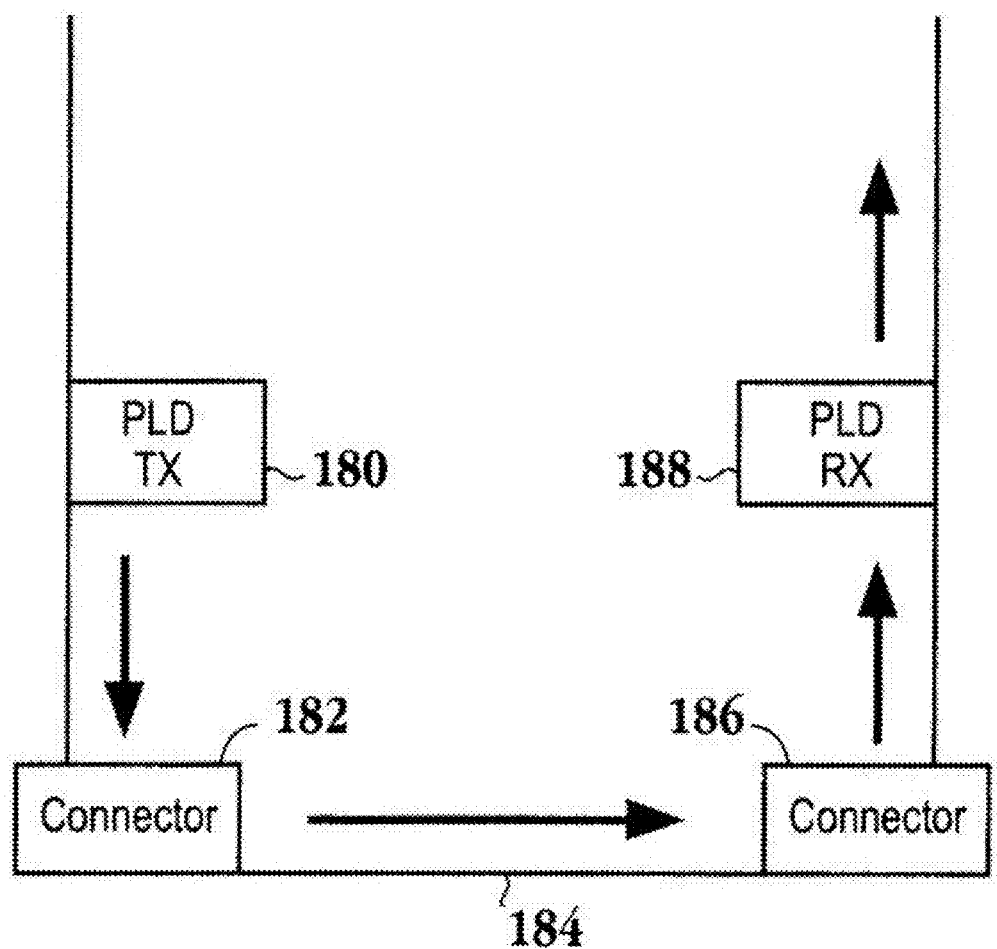
FIG. 8 is a simplified schematic diagram of one application in which the programmable logic device of FIG. 7 may be utilized.

FIG. 8 is a simplified schematic diagram of one application in which the programmable logic device of FIG. 7 may be utilized. Here, programmable logic device 180 includes transmit circuitry which will transmit data to connector 182. Connector 182 then provides data to connector 186 across back plane 184. Connector 186 provides the data to receive circuitry of PLD 188. It should be appreciated that the programmable logic devices 180 and 188 may be embodied in line cards. It should be further appreciated that back plane 184 may be substituted with fiber optic cable, coaxial cable, a wireless connection, etc. PLD 180 and PLD 1.88 may include receive circuitry and transmit circuitry, respectively, and are not shown as such for illustrative purposes.

Figure 9:
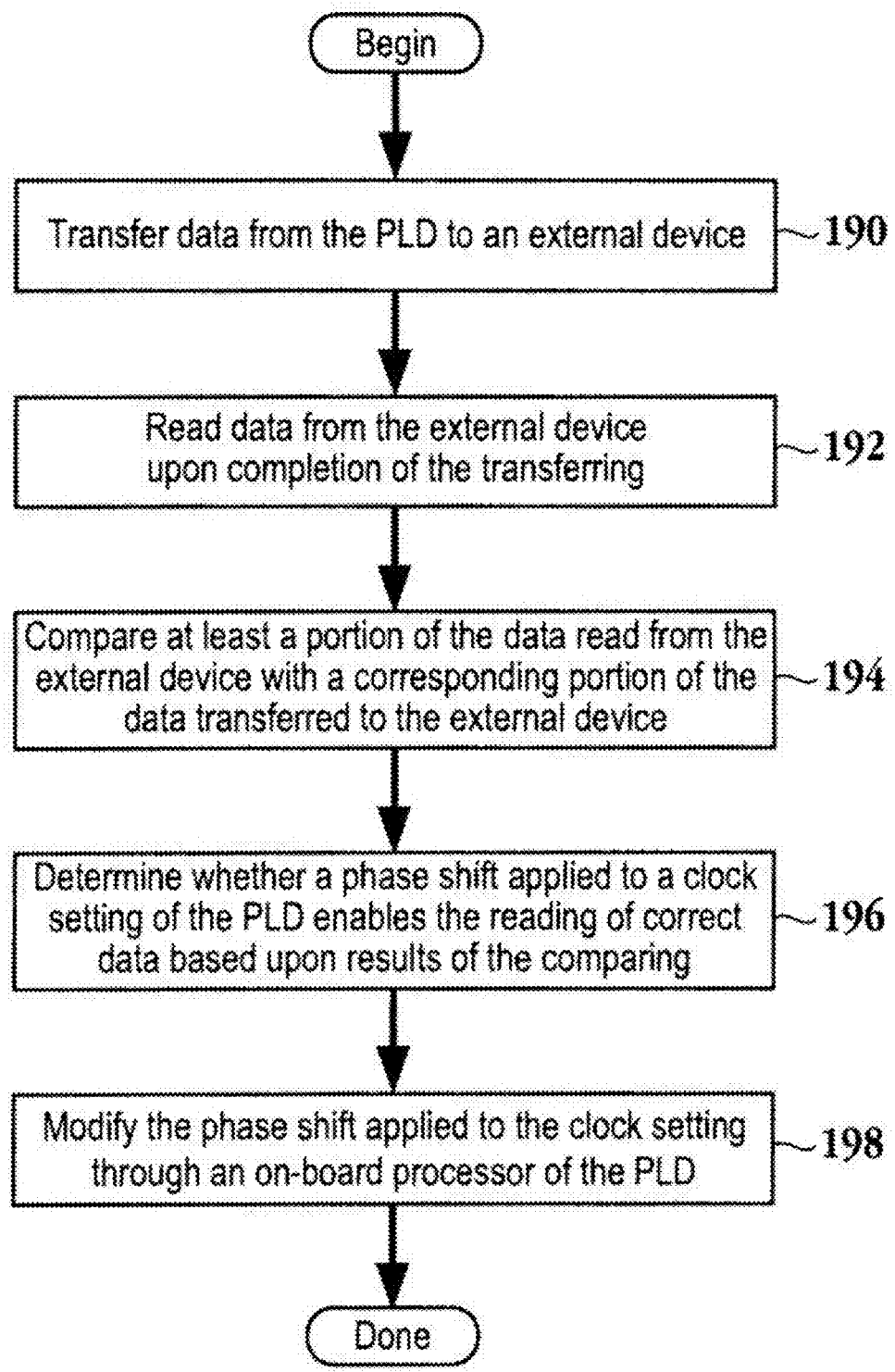
FIG. 9 is a flow chart diagram illustrating the method operations for optimizing data transfer into a programmable logic device in accordance with one embodiment of the invention.

FIG. 9 is a flow chart diagram illustrating the method operations for optimizing data transfer into a programmable logic device in accordance with one embodiment of the invention. The method initiates with operation 190 where data from the PLD is transferred to an external device. For example, the data from the PLD may be transferred to a memory as described with reference to FIG. 2. The method then advances to operation 192 where the data from the external device is read upon completion of the transferring operation. Here, a processor embedded within the PLD may issue write commands, terminate the write operation, and then issue read commands to read the memory address just written into. The method then proceeds to operation 194 where at least a portion of the data read from the external device is compared with a corresponding portion of the data transferred to the external device. As described above, the data is transferred across different clock domains and read logic will perform a comparison to verify whether the correct data was read.

Still referring to FIG. 9, in operation 196 it is determined whether a phase shift applied to a clock setting of the PLD enables the reading of correct data based upon the results of the comparing. That is, the data read from the memory is compared to a copy of the data written to the memory for the corresponding memory address in order to identify whether the data matches. If the data matches, then a pass condition as described in reference to the table of FIG. 4 occurs. If the data does not match, then a fail situation occurs. The method then advances to operation 198 where the phase shift applied to the clock setting is modified by an on-board processor of the PLD. The method operations described above repeat as the processor sweeps through the phase range automatically to generate data that identifies the phase window, e.g., the table of FIG. 4. Thus, rather than having test equipment issue signals to stimulate a response which is then measured, the embodiments described herein use the embedded processor and programming capability of the PLD to internally optimize the timing.

Figure 10:
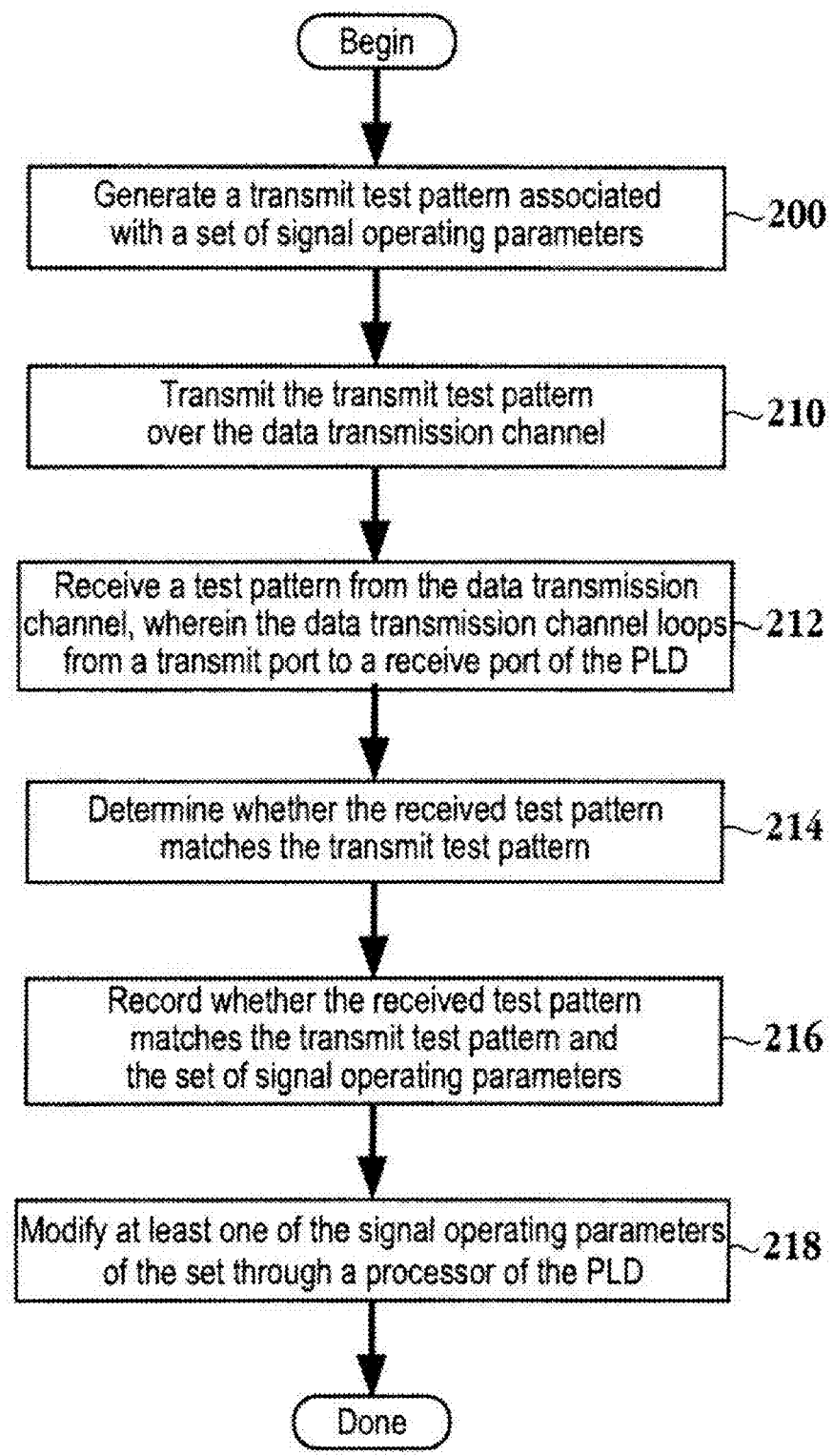
FIG. 10 is a flow chart diagram illustrating the method operations for optimizing signal operating parameters for a signal sent over a data transmission channel through a programmable logic device in accordance with one embodiment of the invention.

FIG. 10 is a flow chart diagram illustrating the method operations for optimizing signal operating parameters for a signal sent over a data transmission channel through a programmable logic device in accordance with one embodiment of the invention. The method initiates with operation 200 where a transmit test pattern associated with a set of signal operating parameters is generated. As discussed with reference to FIG. 5, the signal operating parameters may include a pre-emphasis adjustment value, a Vod, value and an equalizer adjustment value. In operation 210 the transmit test pattern is encoded and transmitted over a data transmission channel. Then, in operation 212 the test pattern from the data transmission channel is received by a receive portion of a transceiver of the PLD. It should be appreciated that the data transmission channel loops from a transmit port to a receive port of the PLD. The method then proceeds to operation 214 where it is determined whether the received test pattern matches the transmit test pattern. Here, the received test pattern may be decoded and compared to the transmitted test pattern through comparators of the PLD.

The method of FIG. 10 then proceeds to operation 216 where it is recorded whether the received test pattern matches the transmitted test pattern, and the set of signal operating parameters are also tabulated along with this result. An exemplary tabulation is illustrated with reference to FIG. 7. The method then moves to operation 218 where at least one of the signal operating parameters of the set are modified. For example, the pre-emphasis adjustment value, the $V_{od}$ value, and/or the equalizer adjustment value may be modified to provide the results for a different set of signal operating parameters. It should be appreciated that the signal operating parameters are modified through the processor of the PLD, thereby eliminating the need for external test equipment to optimize the signal operating parameters for the high-speed interface. Each of the combinations of the signal operating parameters is swept through to automatically generate data to identify the optimal signal operating parameters.

In summary, the above-described invention provides a method and apparatus for optimizing the timing characteristics and signal operating parameters for a PLD without the need for external testing equipment. The embodiments described above take advantage of an embedded processor within the PLD and the ability to program blocks of the PLD to provide analysis of signals within the PLD.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for improving data transfer, the method comprising:
   a) transferring data from an integrated circuit (IC) to an external device;
   b) reading the data from the external device and writing the data into a first register of the IC according to a clock domain signal of the external device;
   c) transferring the data from the first register of the IC to a second register of the IC according to a clock domain signal of the IC;
   d) comparing at least a portion of the data from the second register with a corresponding portion of the data transferred to the external device; and
   e) determining whether a phase shift applied to the clock domain signal of the IC enables the reading of correct data based upon results of the comparing.

2. The method of claim 1, further comprising:
   setting a phase shift range;
   modifying the phase shift applied to the clock domain signal of the IC through an on-board processor of the IC;
   repeating method operations b)-e) for a plurality of phase shifts within the phase shift range; and
   recording each of the plurality of phase shifts and corresponding comparison data of the data read and the data transferred.

3. The method of claim 1, wherein the IC controls each method operation without assistance of external test equipment.

4. The method of claim 1, wherein the external device is a memory module and wherein the first register is a double data rate register and the second register is a single data rate register.

5. The method of claim 1, further comprising:
   modifying logic blocks associated with method operations a) and b) for a specified application.

6. The method of claim 2, wherein the recording includes:
   generating a table illustrating a phase shift window within the phase shift range, the phase shift window defining phase shifts resulting in reading of correct data.

7. A method for improving signal operating parameters, comprising:
   storing a test pattern associated with a set of signal operating parameters within a memory module of an integrated circuit(IC), the test pattern being a binary bit test pattern;
   transmitting the test pattern from the memory module of the IC over a data transmission channel external to the IC;
   receiving the test pattern from the data transmission channel into the IC;
   determining whether the received test pattern matches the transmitted test pattern by comparing binary bit patterns of the received test pattern and the stored test pattern through circuitry of the IC;
   recording whether the received test pattern matches the transmitted test pattern and the set of signal operating parameters; and
   modifying at least one of the signal operating parameters of the set through circuitry of the IC.

8. The method of claim 7, further comprising:
   repeating the transmitting, receiving, determining, recording, with the modified signal operating parameters.

9. The method of claim 7, wherein each of the method operations are controlled by the processor of the IC without the assistance of external test equipment.

10. The method of claim 7, wherein the signal operating parameters are selected from the group consisting of a pre-emphasis adjustment value, a voltage amplitude value, and an equalizer adjustment value.

11. The method of claim 8, further comprising:
    changing properties associated with the data transmission channel; and
    repeating the transmitting, receiving, determining, and recording.

12. An integrated circuit (IC), comprising:
    a processor defined by a first portion of a logic of the IC, the processor operable to provide a plurality of sets of signal parameter settings for transmitting a binary bit test pattern and receiving the test pattern;
    a memory region defined by a second portion of the logic of the IC, the memory region operable to store the test pattern;
    a transceiver having a transmitting portion operable to transmit the test pattern and a receiving portion operable to receive the test pattern, the transceiver operable to receive one of the plurality of sets of signal parameter settings from the processor, the transmitting portion operable to provide the test pattern to an external data transmission channel, the receiving portion operable to receive the test pattern from the data transmission channel; and comparison circuitry operable to compare the received test pattern with the transmitted test pattern, wherein the processor is operable to sweep through permutations of the plurality of sets of signal parameter settings for different transmissions, the processor operable to track results from the comparison circuitry for each of the different transmissions.

13. The IC of claim 12, wherein the signal parameter settings are selected from the group consisting of a pre-emphasis adjustment value, a voltage amplitude value, and an equalizer adjustment value.

14. The IC of claim 12, wherein the data transmission channel may be changed to represent varying communication pathway lengths.

15. The IC of claim 12, wherein the IC is incorporated into a system, the system including a computing terminal in communication with the processor, the computing terminal displaying a table representing the results of the comparison circuitry and a corresponding one of the plurality of sets of signal parameter settings for each of the plurality of sets of signal parameter settings.

16. The IC of claim 12, further comprising:
formatting circuitry operable to encode the transmitted test pattern; and
formatting circuitry operable to decode the received test pattern.

* * * * *